United States Patent [19]
Wu et al.

[11] Patent Number: 5,191,404
[45] Date of Patent: Mar. 2, 1993

[54] HIGH DENSITY MEMORY ARRAY PACKAGING

[75] Inventors: Andrew L. Wu, Shrewsbury; Donald W. Smelser, Bolton; E. William Bruce, II, Lunenburg, all of Mass.; John O'Dea, Galway, Iran

[73] Assignee: Digital Equipment Corporation, Maynard, Mass.

[21] Appl. No.: 767,571

[22] Filed: Sep. 30, 1991

Related U.S. Application Data

[63] Continuation of Ser. No. 453,518, Dec. 20, 1989, abandoned.

[51] Int. Cl.⁵ .................. H01L 25/12; H01L 25/16; H01L 23/12
[52] U.S. Cl. ...................... 257/724; 361/412; 257/723
[58] Field of Search .............. 357/80, 75, 74, 81, 357/68, 71; 361/391, 412, 393; 174/52.4; 439/60, 61, 63, 64, 65, 68, 69, 73, 74

[56] References Cited

U.S. PATENT DOCUMENTS

| | | | |
|---|---|---|---|
| 3,414,892 | 12/1968 | McCormack et al. | 340/174 |
| 3,588,852 | 6/1971 | McCormack et al. | 340/174 |
| 3,614,541 | 10/1971 | Farrand | 361/394 |
| 3,676,926 | 7/1972 | Kendall . | |
| 3,769,679 | 11/1973 | Kendall . | |
| 3,805,117 | 4/1974 | Hausman | 361/395 |
| 3,877,064 | 4/1975 | Scheingold et al. . | |
| 4,009,485 | 2/1977 | Koenig . | |
| 4,059,849 | 11/1977 | Mitchell | 361/395 |
| 4,283,755 | 8/1981 | Tracy | 361/393 |
| 4,316,321 | 2/1982 | Wichham . | |
| 4,365,284 | 12/1982 | Tanaka et al. | 361/395 |
| 4,481,559 | 11/1984 | Buck et al. | 361/395 |
| 4,578,697 | 3/1986 | Takemae | 357/75 |
| 4,592,617 | 6/1986 | Seidler . | |
| 4,638,348 | 1/1987 | Brown et al. | 357/74 |
| 4,640,499 | 2/1987 | Hemler et al. . | |
| 4,647,126 | 3/1987 | Sobota, Jr. . | |
| 4,647,126 | 3/1987 | Sobota, Jr. | 339/176 F |
| 4,688,150 | 8/1987 | Peterson | 174/52.4 |
| 4,703,393 | 10/1987 | Yamamoto et al. . | |
| 4,730,238 | 3/1988 | Cook | 361/414 |
| 4,763,188 | 8/1988 | Johnson | 357/74 |
| 4,766,478 | 8/1988 | Dennis | 357/70 |
| 4,771,366 | 9/1988 | Blake et al. | 439/67 |
| 4,782,589 | 11/1988 | Dennis | 29/827 |
| 4,827,611 | 5/1989 | Pai et al. . | |
| 4,882,657 | 11/1989 | Braun | 361/412 |
| 4,894,749 | 1/1990 | Elko et al. | 361/391 |

FOREIGN PATENT DOCUMENTS 0850238 4/1986 European Pat. Off. .
8500238 4/1986 Fed. Rep. of Germany .
(List continued on next page.)

OTHER PUBLICATIONS

"Clipped Decoupled Twin-Carrier Module for IC Memory Chips"–Hinrichsmeyer et al.–IBM Technical Disclosure Bulletin vol. 27, No. 8–Jan. 1985.
(List continued on next page.)

*Primary Examiner*—Rolf Hille
*Assistant Examiner*—S. V. Clark
*Attorney, Agent, or Firm*—Cesari and McKenna

[57] ABSTRACT

A low-profile, high-density package for intergrated circuit chips is provided. A first multichip memory module includes first and second interconnect members having low-profile memory chips mounted on a first side of each member. Low-profile edge clips are employed to mechanically connect a second side of the second member to a second side of the first member, and to electrically connect the first sides of the members to a first surface of a circuit board. Likewise, a second multichip memory module includes first and second interconnect members having low-profile memory chips mounted to a first side of each member. Low-profile edge clips are employed to mechanically connect the second sides of the members, and to electrically connect the first sides of the members to a second surface of the circuit board. A thermal management technique that distributes thermal loads is thereafter applied to create a high-density package capable of insertion into a standard computer backplane and cabinet.

5 Claims, 6 Drawing Sheets

FOREIGN PATENT DOCUMENTS

| | | | |
|---|---|---|---|
| 1-71162 | 3/1979 | Japan | 357/75 |
| 59-136963 | 8/1984 | Japan | 357/75 |
| 59-227147 | 12/1984 | Japan | 357/75 |
| 60-117763 | 6/1985 | Japan | 357/75 |
| 61-75558 | 4/1986 | Japan | 357/75 |

OTHER PUBLICATIONS

IBM Technical Disclosure Bulletin, vol. 27, No. 8, Jan. 1985, pp. 4857–4858.

IBM Technical Disclosure Bulletin, vol. 28, No. 10, Mar. 1986 pp. 4360–4361, N.Y., "Surface mount substrate lead".

IBM Technical Disclosure Bulletin, vol. 22, No. 2, Jul. 1979, pp. 573–574, N.Y., B. T. Clark, "Thermal Enhancement of Integrated Stacked Modules".

Fujitsu Scientific & Technical Journal, vol. 21, No. 4, Sept. 1985, pp. 452–460, N.Y., M. Takamura et al., "High-Density packaging main of storage".

35th ECC, Washington, DC, 20th–22nd May 1985, IEEE 0569-5503/85/0000-0512, pp. 512–516, IEEE, N.Y., I. Munakata et al., "An advanced multi-layer technology in thick film hybrid circuits".

Article entitled "A New Face Down Bonding Technique Using a Low Melting Point Metal" by Miki Mori, Masayuki Saito, Akinori Hongu, Akira Miitsuma, and Hiroshi Ohdaira, from "Proceedings of 1989 Japan International Electronic Manufacturing Technology Symposium", Apr. 1989 at pp. 114–118.

Article entitled, "High-Density, Large Scale Interconnection For Improved VLSI System Performance" by W. J. Bertram, Jr. from Technical Digest, 1987 International Electron Devices Meeting, Dec. 1987 at pp. 100–103.

Article entitled, "High-Accuracy Inner Lead Bonding Technique" by Yukihiro Ikeya, Koichiro Atsumi, Noriyasu Kashima, Yoichiro Maehara, Keitaro Okano, from Proceedings of 1989 Japan International Electronic Manufacturing Technology Symposium, Apr. 1989 at pp. 71–74.

HIGH DENSITY MEMORY ARRAY PACKAGING

This is a continuation of application Ser. No. 07/453,518, filed on Dec. 20, 1989, now abandoned.

FIELD OF THE INVENTION

The invention relates to a method and apparatus for high-density memory array packaging and, more specifically, to a packaging technique having a circuit board populated on both sides with high-density multichip memory modules.

BACKGROUND OF THE INVENTION

Advances in modern semiconductor fabrication technologies have impacted the computer industry and increased the demand for higher speed, lower cost, and higher density computer systems. Integrated circuit (IC) feature sizes have been reduced to approximately 1 micron, thereby facilitating an increase in the scale of circuit integration. Today, the function of a computer's central processing unit (CPU) can be implemented on a single IC chip, making possible computer systems that operate at high speeds. In order to maximize the benefit of such chip level capabilities, the performance of a memory subsystem must closely match that of the computer and, more specifically, that of the CFU.

The size and cost of the memory subsystem are major factors in the price/performance of the computer system. The maximum size of main memory is generally limited by the addressing capability of the CFU. With the development of high performance CPU chips, fast and large memory capabilities are required. However, modern random access memory devices or RAMs are relatively expensive and may constitute a large percentage of the total computer system size. Accordingly, high-density memory array packaging techniques are desired, particularly ones that can utilize older, less expensive memory chip technology without requiring redesign of existing computer platforms or cabinets. In some cases, high-density memory packaging may necessitate redesign of computer platform/cabinet elements such as the backplane, due to violation of spacing requirements, or the cooling system, due to an inability to remove heat from the high-density packages.

Another requirement of main memory is a high speed interconnection between the RAMS within the main storage subsystem and the CPU chips, since such off-chip interconnection is a limiting factor in realizing overall system performance. Memory devices, in general, are bus-oriented, thus making the interconnection between main memory and the CPU less complex and less prone to error. Nevertheless, the interchip interconnection strategy of the RAMs must minimize the contribution of added inductances and stray capacitances, so as to avoid decreasing memory subsystem performance.

Therefore, in accordance with an aspect of the present invention, a feature is to provide a new and improved method and apparatus for high-density memory array packaging which results in a larger and more economical memory subsystem.

Additionally a feature of the present invention is to provide a low-profile, thermally managed, high-density memory array package such that the memory array package may be inserted into a standard computer backplane without the need for redesign of the backplane or computer cooling system due to violation of spacing requirements or cooling specifications.

In accordance with another aspect of the present invention, a feature is to provide a high-density multichip module interconnecting memory chips on a multilayer interconnect member to a circuit board, thereby increasing the performance and density of the memory subsystem.

A further feature of the present invention is to provide a new and improved method and apparatus for high-density memory array packaging that integrates less complex, higher yielding and less expensive RAM devices on an interconnect member.

SUMMARY OF THE INVENTION

The foregoing and other features of the invention are accomplished by providing a low-profile, high-density package for IC chips, the package being configured for insertion into a computer backplane having connectors at a predetermined equally spaced distance between each other. In general, a first multichip memory module is provided for high density packaging of IC chips to a circuit board. A first multilayer interconnect member is constructed having a first side and a second side with the first side having electrically conductive portions for transmitting and receiving electrical signals. Low-profile memory chips are then mounted on the first side in conductive relation with the conductive portions Likewise, a second multilayer interconnect member is constructed having first and second sides with the first side having electrically conductive portions for transmitting and receiving electrical signals. Low-profile memory chips are mounted on its first side in conductive relation with the conductive portions. The second side of the second member is thereafter affixed to the second side of the first member, and low-profile edge clips are subsequently applied to electrically and mechanically connect the conductive portions on the first sides of the members to respective conductive portions on a first surface of a circuit board.

A second multichip memory module is also provided, the second multichip memory module including first and second multilayer interconnect members constructed in a manner similar to that described above. Low-profile memory chips are mounted to the first sides of the members again in a manner similar to the first multichip memory module described above. The second sides of the members are joined together and low-profile edge clips are subsequently applied to electrically and mechanically connect the conductive portions on the first sides of the members to respective conductive portions on a second surface of the circuit board. A thermal management technique that distributes thermal loads is thereafter applied, thereby creating a high-density package capable of insertion into a standard computer backplane connector.

In an alternate embodiment of the invention, low-profile memory chips are mounted to a first and second side of each of at least two interconnect members, the interconnect members having electrically conductive portions on their first and second sides. The memory chips are mounted in conductive relation with the conductive portions of the interconnect members. Low-profile edge clips are used to mechanically and electrically connect one of the interconnect members to a first surface of a circuit board and another of the interconnect members to a second surface of the circuit board. The thus-assembled package is then capable of insertion into a standard computer backplane without the need for redesign. Therefore, in accordance with the purpose of the invention as embodied and broadly described herein. a low-profile, high-density package apparatus for integrated circuit chips is provided, the apparatus being configured for insertion into a computer backplane having a plurality of equally spaced connectors with a predetermined distance between adjacent ones thereof. The connectors are configured for receiving a plurality of adjacent boards. The apparatus comprises (i) a circuit board having electrically conductive portions on a first surface and a second surface, the circuit board being further configured for insertion into a connector of the backplane; (ii) at least two generally planar multichip modules, each having a first side and a second side, each of the multichip modules having low-profile, integrated circuit chips mounted to the first and second sides thereof in conductive relation with electrically conductive portions on the first and second sides, the low-profile chips being arranged so as to be activated and deactivated in a pattern that avoids undue concentration of thermal dissipation, thereby distributing the thermal loads created by the chips; and (iii) edge connection means for mechanically connecting one of the at least two multichip modules to selected points of said conductive portions of the first surface of the circuit board and another of the at least two multichip modules to selected points of the conductive portions of the second surface of the circuit board, with the connection means being configured, dimensioned and arranged for providing electrical connections from the selected points of the conductive portions of the circuit board to selected points of the conductive portions of the first and second sides of the multichip modules. The thus-assembled, low-profile package is capable of insertion into the backplane connector without the need of redesign to change the predetermined distance to accomodate adjacent boards in adjacent connectors of the backplane.

Other objects, features and advantages of the invention will become apparent from a reading of the specification when taken in conjunction with the drawings, in which like reference numerals refer to like elements in the several views.

DESCRIPTION OF THE PREFERRED EMBODIMENTS

Figure 1:
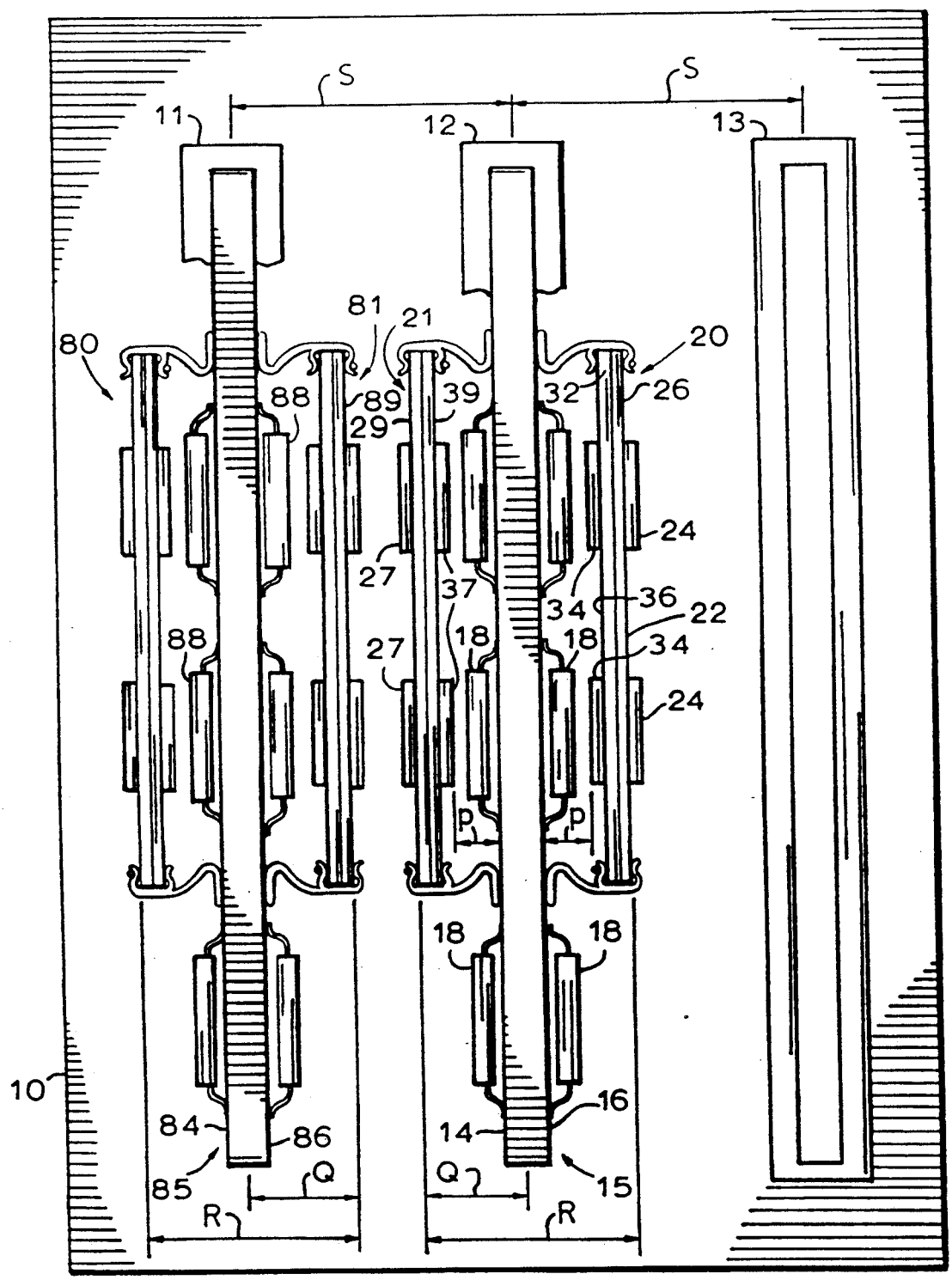
FIG. 1 is a front diagrammatic view of a computer backplane housing a high-density memory array packaging apparatus according to the invention.

Referring to the drawings, and particularly to FIG. 1, there is shown a front plan view of the interior of a computer backplane 10, which is of the type installed in a typical computer enclosure or cabinet (not shown). The backplane 10 is a conventional backplane which includes a plurality of adjacent, equally spaced edge connector receptacles 11-13 that define, in part, backplane slots (not shown). Each connector 11-13 is configured for receiving a circuit board capable of insertion into a backplane slot that typically measures a distance S in the range of 0.5 to 1.0 inches from the center of one connector 12 to the center of an adjacent connector 11,13. Two adjacent circuit boards are shown in FIG. 1 and have been designated generally by the reference numerals 15,85.

Circuit board 15 (85) is, for example, a printed wiring board of the conventional type, that is, a generally rectangular, generally planar, plate-shaped member having an electrical edge connector portion on one edge thereof (not shown) for insertion into one connector 12 or slot of the backplane 10. Circuit board 15 consists of an insulative substrate material having conductive lamina on two major, opposite surfaces 14,16 thereof, with selected portions of the conductive lamina removed to define conductive paths assembled on the two major surfaces. Circuit board 15 may also have numerous internal conductive and non-conductive layers sandwiched between the outer, opposite surfaces 14,16.

Figure 2:
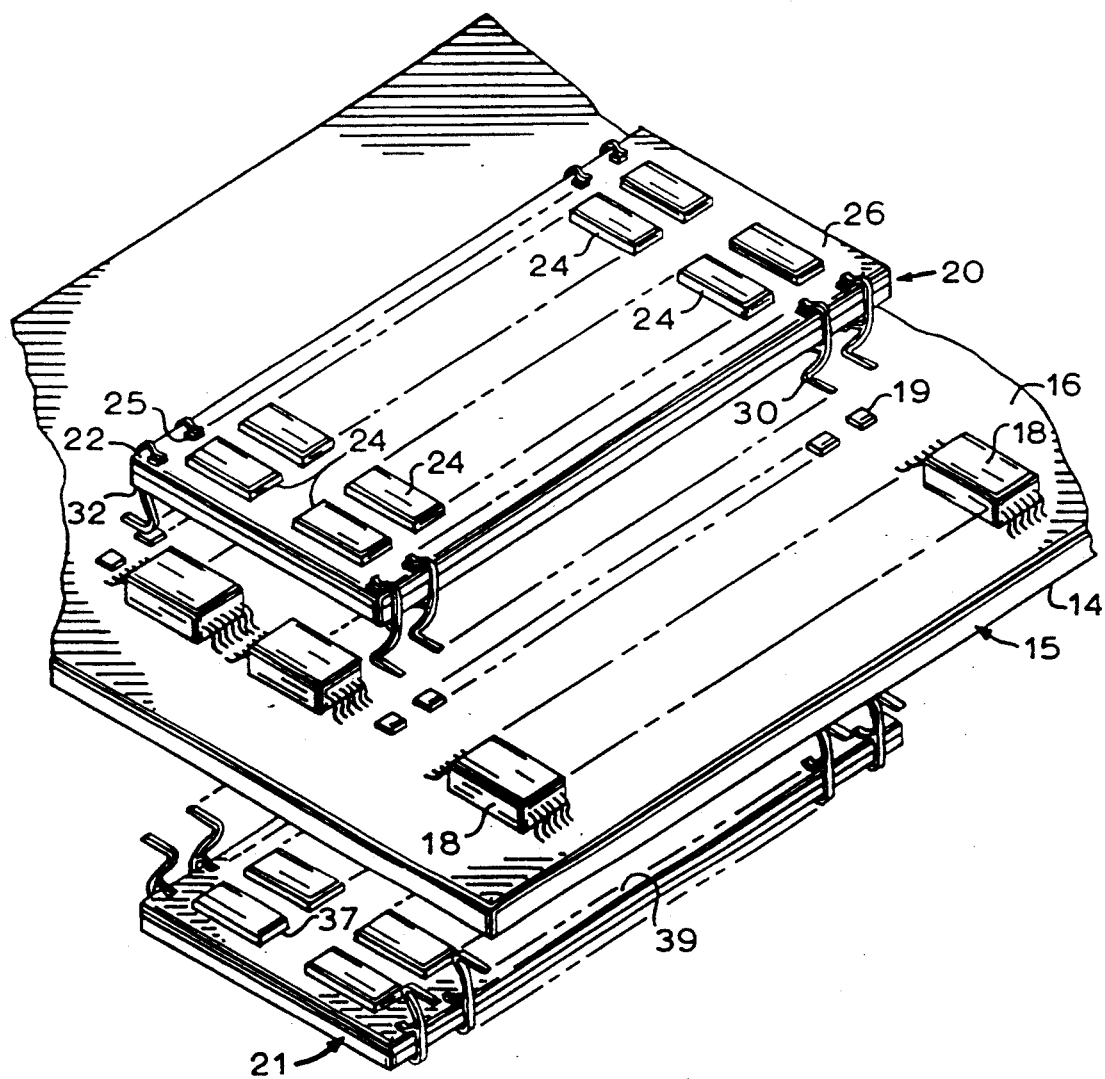
FIG. 2 is an exploded perspective view of the high-density memory array packaging apparatus used in the backplane of FIG. 1.

Referring now to FIGS. 1 and 2, there is illustrated an embodiment of the high-density packaging apparatus of the present invention whereby circuit board 15 is populated on both surfaces 16,14 with surface-mount electronic components including IC devices or chips 18. Two multichip memory modules 20,21 are also shown in relation thereto. It is to be understood that the invention is equally applicable to a high-density packaging apparatus that does not have electronic components surface-mounted directly to the surfaces 16,14 of circuit board 15, but that is populated with one or more multichip modules 20,21 on both surfaces 16,14. Yet, the embodiment shown in FIGS. 1 and 2 will be used to exemplify, among other things, the thermal management issues associated with such packaging apparatus.

The elements in FIGS. 1 and 2 (and FIGS. 3–6) are somewhat exaggerated and are not drawn to scale for purposes of ease of depiction and ease of description. Specifically, no attempt has been made to depict the total number of chips mounted on the circuit boards or multichip memory modules, or the scale size of the chips and modules connected to the circuit board, although the drawings depict the relationship relative to one another.

Mounted on both surfaces 16,14 of circuit board 15 are a plurality of electronic components including IC chips 18. Each chip 18 may be either a passive device, or a very large scale integration (VLSI) or ultra large scale integration (ULSI) active device fabricated with one of a number of different technologies, such as metal-oxide-semiconductor (MOS). It will be apparent to those skilled in the art that other technologically similar IC chips may utilize the teachings and advantages of the inventive concepts described herein; however, for an embodiment of the present invention, such devices are either static random access memory (SRAM) or dynamic RAM (DRAM) chips 18.

The DRAM chips 18 are mounted in conductive relation to the conductive portions of circuit board 15 using known surface mount techniques and packages, some examples of which are Very Small Outline Package (VSOP), Thin Small Outline Package (TSOP), and packages resulting from the Tape Automated Bonding (TAB) process. These packaging techniques are referred to as "low-profile" chip packaging technologies, that is, the height of the packages, which typically measures less than 0.045 inches, is much smaller than conventional Small Outline J-Lead (SOJ) packages, which typically measure 0.15 inches. Low-profile chip packaging allows for double-sided, surface-mounting of components on circuit boards without violating conventional backplane slot spacing requirements.

In accordance with the teachings of the invention, a low-profile, high-density memory packaging apparatus is provided, such apparatus including a first high-density, multichip memory module 20 mounted to the surface 16 of circuit board 15, the module 20 including chips 24 mounted to a side 26 and chips 34 mounted to a side 36 thereof. Likewise, a second high-density, multichip memory module 21, similar to module 20, is mounted to the surface 14 of circuit board 15, the module 21 including chips 27 mounted to a side 29 and chips 37 mounted to a side 39 thereof. Multichip modules 20,21 are configured, arranged and positioned in a manner generally parallel to and in proximate relation to the surfaces 16,14 of circuit board 15, that is, the distance P between the surfaces 16,14 of circuit board 15 and the closest portions of modules 20,21 in acing relation to circuit board 15 is generally equal and in the range of approximately 0.050–0.100 inches.

Referring only to FIG. 1 at this point, circuit board 85 is shown inserted into connector 11 of backplane 10 and adjacent to the high-density memory packaging apparatus of circuit board 15. Adjacent circuit board 85 is populated with chips 88 and multichip memory modules 80,81 in a manner similar to that described for circuit board 15, and therefore provides, in accordance with the teachings of the invention, another high-density memory packaging apparatus. A feature of the present invention is to provide a low-profile, high-density memory array package such that the package can be inserted into standard, conventional computer backplanes having spacing requirements that typically measure, worst case, a distance S which is approximately 0.5 inches from the center of one connector to the center of an adjacent connector. In accordance with this feature, the relative dimensions of the full populated, high-density memory packages of circuit boards 15,85 are compatible with the above-stated spacing requirement and as such allow insertion of both packages into adjacent connectors of conventional backplanes. In other words, the width R of circuit board 15 (85) having at least two populated multichip modules 20,21 (81,80) mounted to surfaces 16,14 (86,84) thereof respectively is approximately 0.360 inches or, stated differently, the distance 0 from the center of circuit board 15 (85) to furthest point of surface 29 (89) of multichip module 21 (81) in facing relation to each other is 0.180 inches. These dimensions are well within the 0.5 inches spacing requirement of conventional backplanes.

Figure 3:
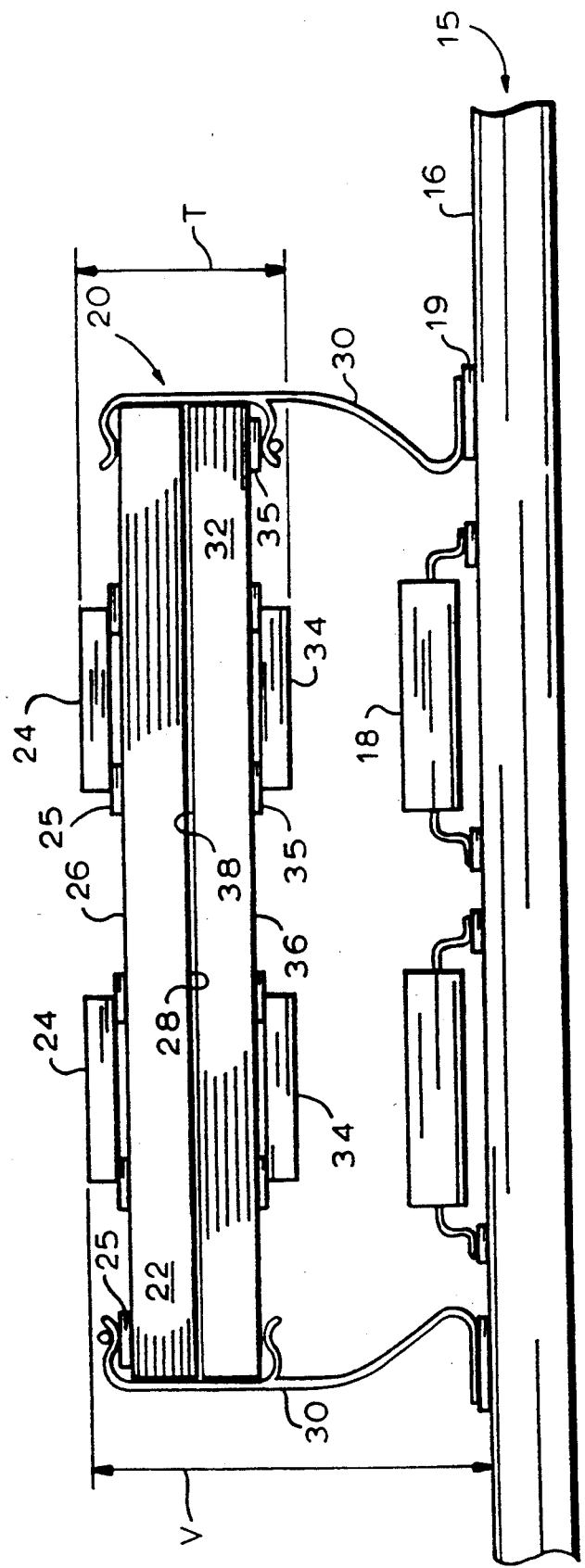
FIG. 3 is a front view of an embodiment of a high-density multichip module used in the memory array packaging apparatus of FIG. 1.

In FIG. 3, the high-density multichip memory module 20 of FIG. 2 is shown, the multichip memory module 20 including a plurality of multilayer interconnect members 22,32 having conductive portions 25,35 on sides 26,36 thereof, the conductive portions 25,35 interconnecting a plurality of chips 24,34, which preferably use silicon as the semiconducting material. Multilayer interconnect member 22 (32) is a generally rectangular, generally planar member consisting of a plurality of conductive and non-conductive layers deposited upon a base of substrate material, as will be further described.

In order to achieve high-density interconnections, multilayer interconnect member 22 is constructed in a manner different from traditional printed wiring boards, that is, the multilayer member 22 is generally produced using thin-film and lithographic techniques similar to those used in semiconductor fabrication. This results in a multilayer interconnect having substantially finer conductor lines and thinner insulating layers than conventional printed wiring boards.

Chip 24 (34) is a ULSI chip fabricated with MOS technology and, for the instant invention, is a DRAM chip, although similar IC chips may be used in accordance with the teachings set forth herein. DRAM chip 24 is also preferably a "bare" DRAM chip, that is, the chip 24 is not housed within a certain IC package or by a certain IC packaging technique. Bare DRAM chip 24 and multilayer interconnect member 22 are individually and separately tested prior to assembly, the chip 24 being assembled to the multilayer member 22 utilizing bare chip assembly technology, an example of which is a technique known as "flip-chip" bonding.

As can be seen in the drawing, a side 28 of the multilayer interconnect member 22 is joined to a side 38 of multilayer interconnect member 32 to form the high-density multichip memory module 20, the multichip module 20 having, a result thereof, a plurality of chip mounting sides 26,36. The sides 28,38 are preferably affixed by an adhesive substance, such as electronic grade epoxy, although those skilled in the art will recognize that other similar, suitable techniques may be used to join the sides 28,38 together in abutting relation, for example with the use of mechanical edge clips.

In accordance with the teachings of the invention, the high-density multichip memory module 20 is coupled to circuit board 15 by edge connection means, a specific example of which are edge clips 30. Edge clips 30 are configured, dimensioned, and arranged to provide electrical connections from conductive portions 19 of circuit board 15 to selected, conductive portions of sides 26,36 of members 22,32, such as conductive portions 25,35 respectively. The electrical connections between edge clips 30 and conductive portions 25,35 of interconnect members 22,32 are established by conventional soldering means, while the electrical connections between edge clips 30 and conductive portions 19 of circuit board 15 are established by conventional surface-mounting means.

Edge clip 30 also provides mechanical coupling and structural support between multichip module 20 and circuit board 15, while providing a "low-profile" to the high-density multichip module 20. In fact, the height T of a multichip module 20 populated with chips 24,34 on both sides 26,36 thereof is approximately 0.130 inches, which is less than conventional SOJ packages, while the height V of the multichip module 20 coupled with edge clip 30 is approximately 0.180 inches. A low-profile edge clip found to be satisfactory in the apparatus of the present invention is shown and described in U.S. Pat. No. 4,592,617 issued to Jack Seidler on Jun. 3, 1986, which patent is expressly incorporated by reference as though fully set forth herein.

Figure 4:
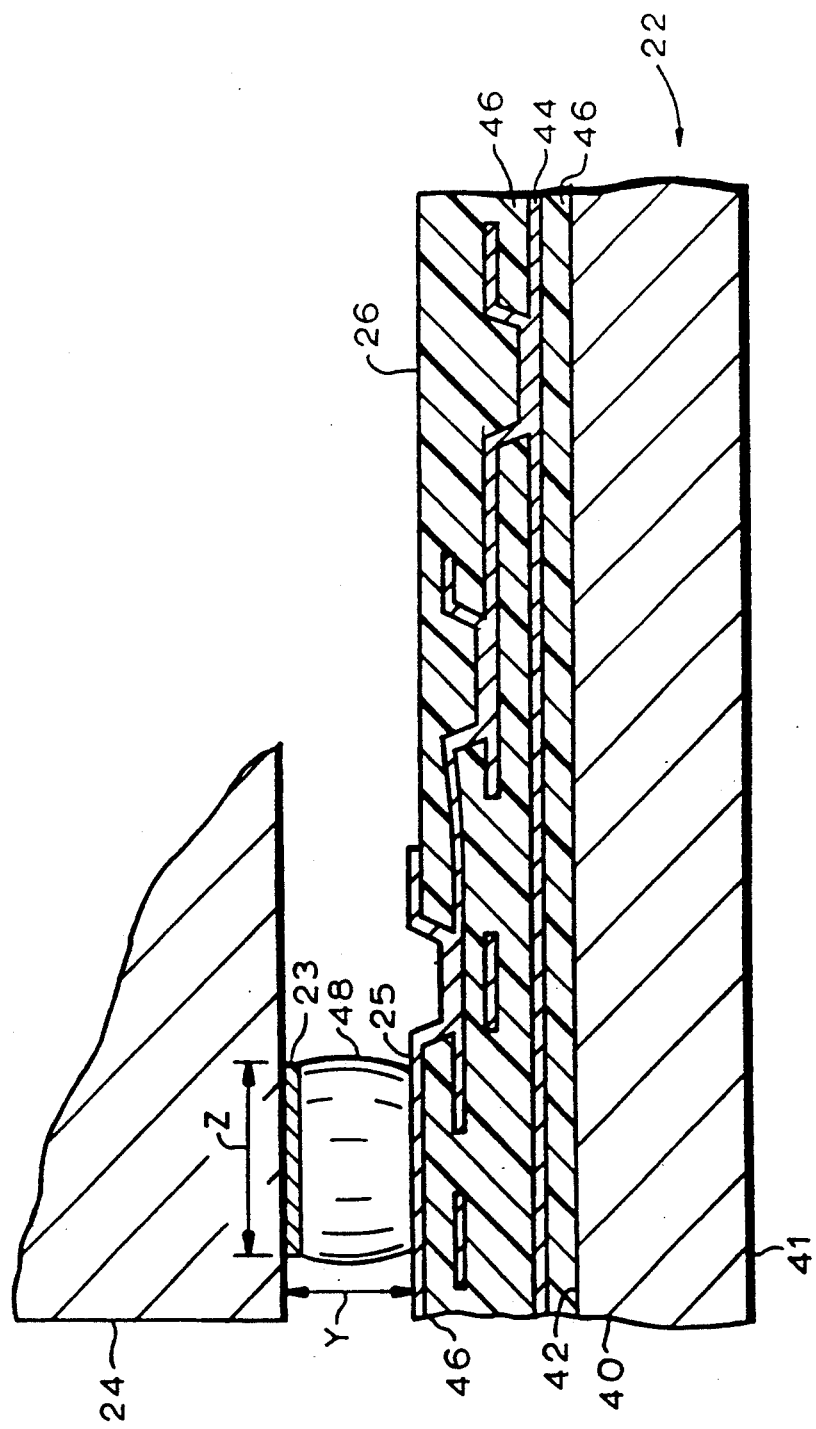
FIG. 4 is a cross-section view of a multilayer interconnect substrate member used in the high-density multichip module of FIG. 3.

Referring now to FIG. 4, the multilayer interconnect member 22 of FIG. 3 is illustrated, the interconnect member 22 being a generally rectangular, generally planar member consisting of a plurality of conductive layers 44 and insulative layers 46 deposited upon a substrate layer 40. The substrate layer 40 forms the base of multilayer interconnect member 22 and, as such, has a top side 42 and a bottom side 41 and a length equal to the length of member 22. Substrate layer 40 may be constructed of any of a number of suitable substrate materials such as ceramic or metal, but for this particular embodiment, silicon is the preferred material due to its good thermal conductivity. The use of silicon also minimizes thermal mismatch when soldering the bonding pads 23 of the chips 24 to the silicon substrate layer 40 of member 22. In other words, by using similar materials, for example silicon for both the bare chips 24 and substrate layer 40, the possibility of thermal mismatch is less, thereby preserving the integrity of the solder bump joint 48 which would otherwise be damaged due to thermal expansion at different rates if dissimilar materials were used.

Disposed upon the top side 42 of the silicon substrate layer 40 are a plurality of layers of conductor 44, preferably constructed of either aluminum or copper material due to their low resistivity, separated by a plurality of layers of insulator 46. As will become more apparent hereinafter, a feature of the present invention lies in the reparability of the multichip memory module 20 or, more specifically, the ability to replace certain bare chips 24 assembled to multilayer interconnect member 22 prior to encapsulation, such repair being a function of the structure of the member 22, i.e. the building of the member 22 upon one side (side 42) of the substrate layer 40. Polyimide is the preferred material for the insulative layers 46 since it has a low dielectric constant and is able to planarize the structure of the underlying conductor patterns when applied by spinning or spraying, thereby allowing for the fabrication of multilayer metallic structures without a step coverage problem.

As previously mentioned, bare chip 24 is assembled to multilayer interconnect member 22 using a technique called flip-chip bonding, a preferred implementation of which is solder bump. Flip-chip bonding involves positioning the bare chip 24 face-down onto the side 26 of interconnect member 22, aligning the bonding pads 23 of chip 24 to the conductive portions 25 of member 22, and thereafter bonding the pads 23 in conductive relation to the conductive portions 25. Unlike conventional printed wiring boards, multilayer interconnect member 22 is designed to accommodate the tight spacing or "pitch" between the bonding pads 23 of chip 24. The pitch between bonding pads 23 typically measures between 0.006–0.008 inches, compared to the pitch between TSOP, VSOP, and TAB package leads, which measures approximately 0.020 inches and which can be accommodated by conventional printed wiring board technology.

Flip-chip bonding is desirable for high-density chip packaging because the footprint or area required to bond the chip 24 to the member 22 is equal to the area of the chip 24 itself, unlike other low-profile packaging technologies VSOP, TSOP, or TAB which require a larger footprint. Flip-chip bonding exploits the use of a relatively small solder bump 48, which typically measures a height Y of approximately 0.001–0.0015 inches and a width Z of approximately 0.002–0.004 inches, required to bond the pad 23 of chip 24 to member 22. In addition to allowing higher packing densities, the small solder bump 48 minimizes added inductances and stray capacitances of longer leads, thus improving signal integrity. Also, since flip-chip bonding allows the mounting of a "bare" chip 24 to multilayer interconnect member 22, the bonding technique helps provide a low-profile height to the multichip module 20, thus helping to reduce the overall size and dimensions of the high-density packaging apparatus.

In accordance with a feature of the invention the bare DRAM chip 24, once assembled to side 26 of multilayer interconnect member 22, can be replaced and, thus, the entire multichip memory module 20 can be repaired prior to encapsulation with a suitable packaging material, for example electronic grade epoxy encapsulant. Repair may be necessary at this point, notwithstanding that both chip 24 and multilayer interconnect member 22 were previously individually tested, since, in some cases, pretesting of the chip 24 at design speed is difficult. Therefore, the possibility exists that chip 24 cannot meet design speed specification or that chip 24 became defective due to the bonding process. In any event, replacing such a chip 24 bonded to side 26 prior to encapsulation is economical in terms of time and cost since it is necessary to reflow the solder on only one side of member 22.

As mentioned previously, another feature of the present invention is to provide a low-profile, high-density memory array package such that the package may be inserted into a standard computer backplane without violating backplane slot spacing requirements. Accordingly, the width of a fully populated memory array package vertically inserted into a standard backplane, that is a package including at least one fully populated multichip memory module mounted to one surface of a circuit board and at least one fully populated multichip memory module mounted to the opposite surface of the circuit board measures approximately 0.360 inches and is compatible with conventional double-sided, surface-mount circuit boards populated with SOJ device packages, thereby allowing for the insertion of the memory array package into a standard computer backplane.

Insertion of such low-profile, high-density packages into a backplane also raises issues associated with the available power and cooling capabilities existing within the computer cabinet. A further feature of the invention includes a memory array package arranged in a manner that distributes the thermal loads created by the high-density interconnection of active devices and chips. In other words, such high-density packaging inherently includes ore devices and chips per unit area, which results in more power dissipation per unit area. A preferred embodiment of the invention utilizes DRAM memory chips having the characteristics of operating in a high-power mode when the chips are being accessed, such as during read/write operations, or in a low-power mode when the chips are retaining current state information. Accordingly, and referring back to FIG. 1, multichip memory module 20 mounted to surface 16 of circuit board 15 is configured such that chips 24, which are bonded to side 26, are in high-power operation or "turned on", while chips 34 located directly beneath and on the opposite surface 36 of multichip memory module 20, are in low-power operation or "turned off". Likewise, and in a similar application, the entire memory array package may be configured such that the multichip memory module 20 is in high-power operation, that is, chips 24,34 are turned on, while multichip memory module 21, or more specifically, chips 27,37 are in low-power operation or turned off. This alternating pattern of activating and deactivating certain memory chips or "memory banks" depending upon their location is repeated throughout the entire memory array package of multichip modules, thus providing, in conjunction with available computer resources, thermal management of the apparatus of the invention. Of course, it will be apparent to those skilled in the art that other activating/deactivating patterns may be employed without deviating from the inventive concepts set forth herein.

In accordance with the teachings of the invention, improved due to the method of encapsulating the DRAMs. The encapsulation of bare chips 24 bonded to the multichip memory module 20 at one time, that is, after the bonded chips are tested, results in an encapsulant being applied that is approximately an order of magnitude thinner than the plastic molding material used to surround conventional SOJ packages. Such encapsulation results in more efficient power dissipation than conventional packaging.

This particular embodiment of the high-density packaging apparatus of the present invention is capable of providing up to six times the memory density as compared to conventional double-sided, surface-mount circuit boards populated with memory devices. The inventors believe that this additional feature of the invention overcomes a limitation of conventional main memory subsystem packaging, namely the need for larger and faster memory capabilities commensurate with overall computer system size and improved computer performance.

Figure 5:
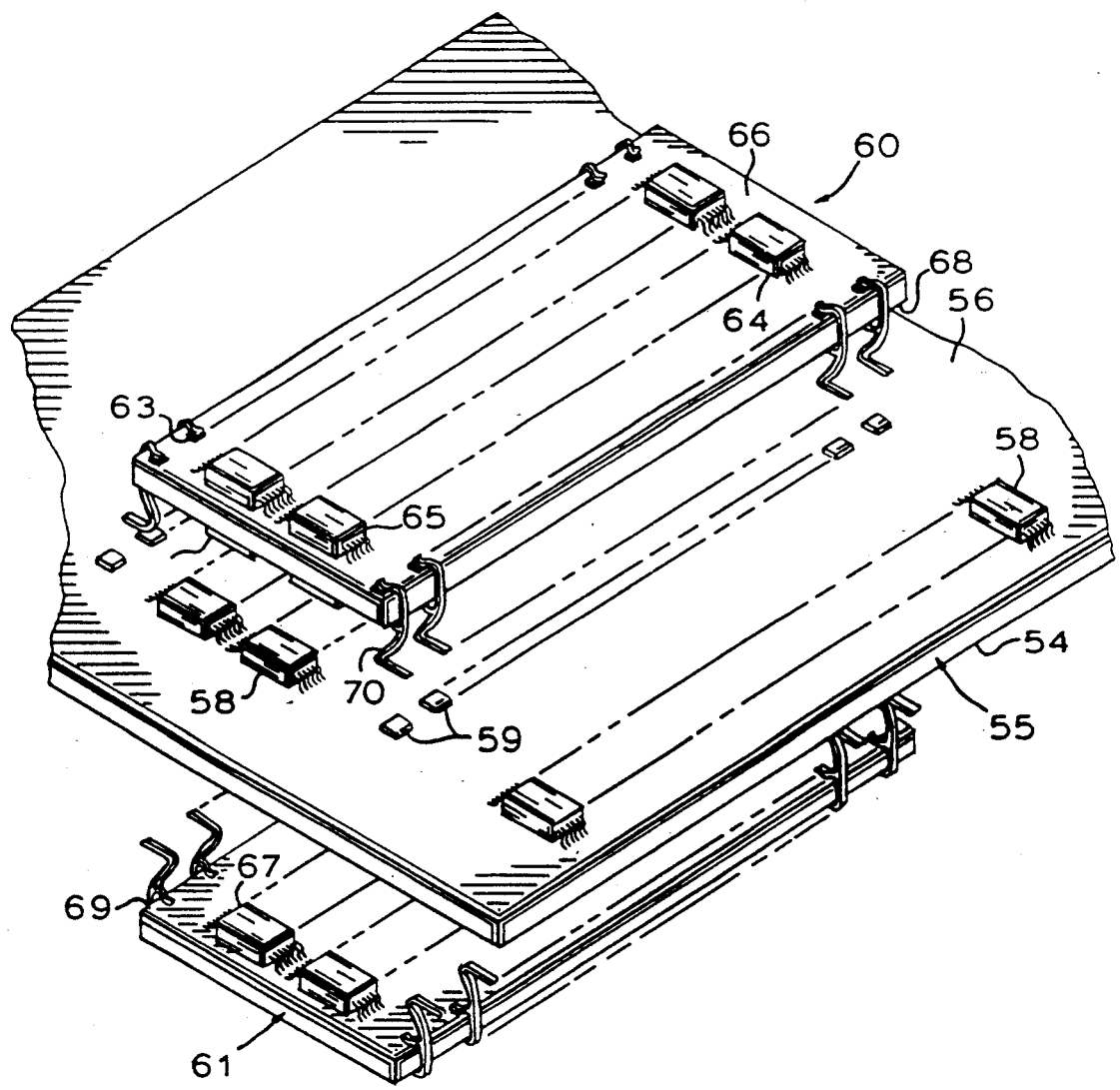
FIG. 5 is a perspective view of an alternate embodiment of the high-density memory array packaging apparatus according to the invention.

FIG. 5 depicts a perspective view of an alternate embodiment of the low-profile, high-density memory array packaging apparatus. In accordance with the teachings of the present invention, the high-density memory packaging apparatus includes a first high-density multichip memory module 60 mounted to a surface 56 of a circuit board 55, the module 60 including chips 64 mounted to a side 66 and chips 65 mounted to a side 68 thereof. Likewise, a second high-density multichip memory module 61, similar to module 60, is mounted to a surface 54 of circuit board 55, the module 61 including chips 67 mounted to a side 69 thereof, as well as chips (not shown) mounted to an opposite side (not shown) thereof. Multichip modules 60,61 are configured, arranged and positioned in a manner generally parallel to and in proximate relation to the surfaces 56,54 of circuit board 55, that is the distance between the surfaces 56,54 of circuit board 55 and the closest points of modules 60,61 to circuit board 55 is generally equal and in the range of approximately 0.050-0.100 inches.

Circuit board 55 is similar to the circuit board 15 of FIG. 1 and, as such, is populated on both surfaces 54,56 with surface-mount electronic components including RAM chips 58. Of course, the invention applies equally to a high-density memory packaging apparatus that does not have electronic components mounted directly to the surfaces 54,56 of circuit board 55. Chips 58 are mounted in conductive relation to the conductive portions of circuit board 55 using known low-profile, surface mount techniques and packages VSOP, TSOP, and TAB.

Figure 6:
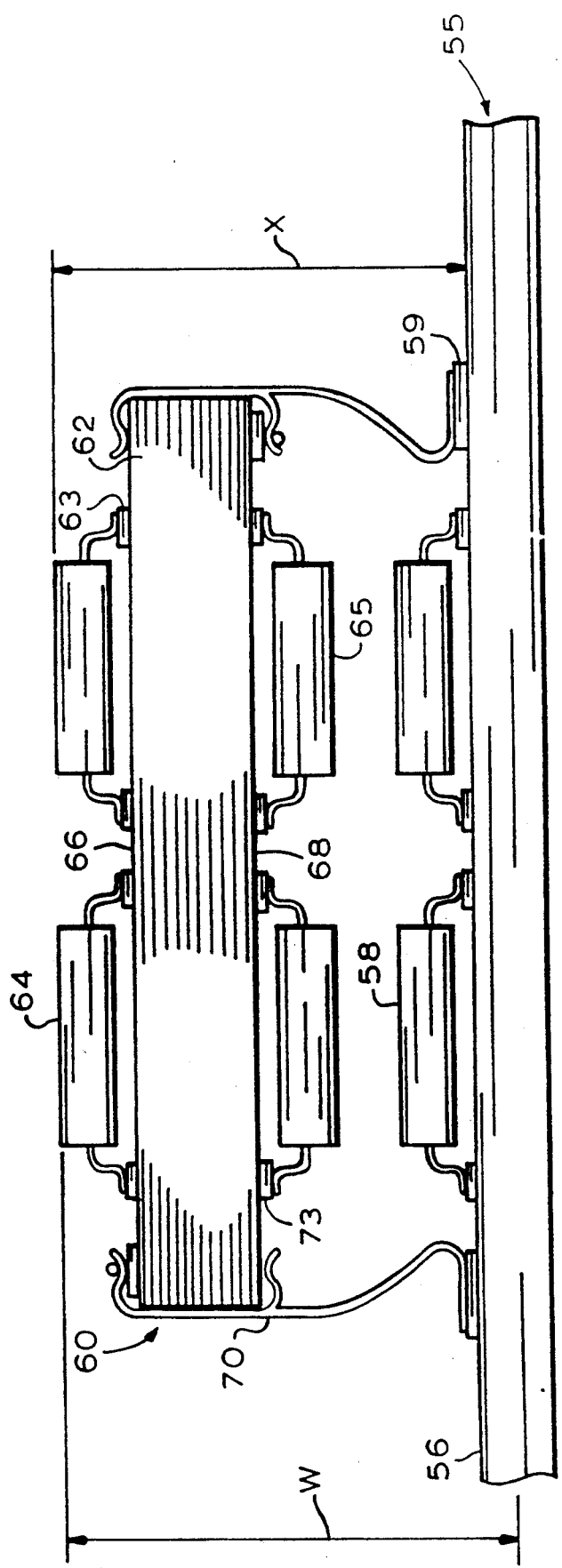
FIG. 6 is a front view of an alternate embodiment of a high-density multichip module used in the memory array packaging apparatus of FIG. 5.

The high-density multichip memory module 60 of FIG. 5 is shown in FIG. 6 and includes an interconnect member 62 having conductive portions interconnecting a plurality of chips 64,65. In accordance with this alternate embodiment of the invention, chips 64,65 are encapsulated within low-profile packages TSOP, VSOP, or TAB. Interconnect member 62, not having to accommodate the limitations imposed by bare chip assembly technology, may now be either a multilayer interconnect member similar to interconnect member 22 of FIG. 4 or a conventional printed wiring board. The chips 64,65 are therefore assembled to the sides 66,68 of interconnect member 62, respectively, using known surface-mounting techniques.

High-density multichip memory module 60 is coupled to circuit board 55 using edge connection means, such as edge clip 70. Edge clip 70, like edge clip 30 of FIG. 3, is configured, dimensioned, and arranged to provide electrical connection from conductive portions 59 of circuit board 55 to selected, conductive portions 63,73 of sides 66,68 of member 62. The electrical connections between edge clips 70 and conductive portions 63,73 of interconnect member 62 are established by conventional soldering means, while the electrical connections between edge clips 70 and conductive portions 59 of circuit board 55 are established by conventional surface-mounting means.

Edge clip 70 also provides mechanical coupling and structural support between multichip module 60 and circuit board 55, while once again providing a low-profile to the multichip module 60. In this alternate embodiment of the invention, however, the height X of multichip module 60 populated with chips 64,65 on both sides 66,68 thereof is approximately 0.165 inches, which is compatible with conventional, low-profile SOJ packages.

The thus-assembled alternate embodiment of the high-density memory array packaging apparatus is capable of providing between three and four times the memory density of conventional double-sided, surface-mount circuit boards populated with memory devices. The distance W from the center of circuit board 55 to side 66 of multichip module 60 is approximately 0.195 inches, which also makes this alternate embodiment of the present invention compatible with conventional computer backplane spacing requirements. Additionally, the alternating pattern of activating and deactivating certain memory banks depending upon their location is implemented throughout the entire packaging apparatus of multichip modules 60,61, therefore providing thermal and power management of existing computer system resources.

While there has been shown and described preferred embodiments of the present invention, it is to be understood that other adaptations may be made within the spirit and scope of the invention. One feature of the invention lies in providing low-profile, high-density packaging of memory array boards while obviating the need for major connector level redesign of existing computer backplanes. Another feature lies in providing thermal management of the low-profile, high-density packaging apparatus, while again obviating the need for major cooling system redesign of existing computer cabinets. Also, it is to be understood that although the preceding description has proceeded with reference to the high-density packaging of older memory chip technology, the invention is equally applicable to newer memory chip technologies and ULSI chip environments in general where high-density chip packaging is significant.

It will therefore be apparent to those skilled in the art that various changes and modifications in the specifically described embodiments can be carried out without departing from the scope of the invention which is to be limited only by the scope of the appended claims.

I claim:

1. Apparatus for providing a low-profile, high-density package for integrated circuit chips, said apparatus configured for insertion into a computer backplane having a plurality of equally spaced connectors with a predetermined distance between adjacent ones thereof, said connectors being configured for receiving a plurality of adjacent boards, said apparatus comprising:
- a circuit board having electrically conductive portions on a first surface and a second surface, said circuit board being further configured for insertion into a connector of said backplane;
- at least two generally planar multichip modules, each having a first side and a second side, each of said multichip modules having low-profile, integrated circuit chips mounted to said first and second sides thereof in conductive relation with electrically conductive portions on said first and second sides, said low profile chips being arranged so as to be activated and deactivated in a pattern that avoids undue concentration of thermal dissipation, thereby distributing the thermal loads created by said chips;
- edge connection means for mechanically connecting one of said at least two multichip modules to selected points of said conductive portions of said first surface of said circuit board and another of said at least two multichip modules to selected points of said conductive portions of said second surface of said circuit board, with said connection means being configured, dimensioned and arranged for providing electrical connections from said selected points of said conductive portions of said circuit board to selected points of said conductive portions of said first and second sides of said multichip modules, such that said thus-assembled, low-profile package is capable of insertion into said backplane connector without the need of redesign to change said predetermined distance to accommodate adjacent boards in adjacent connectors of said backplane.

2. The apparatus of claim 1 wherein said multichip modules further comprise interconnect member means for electrically interconnecting said low-profile chips.

3. The apparatus of claim 2 wherein said low-profile, integrated circuit chips are further mounted to said first and second surfaces of said circuit board in conductive relation with another of said selected points of said conductive portions of said circuit board.

4. The apparatus of claim 3 wherein said edge connection means includes low-profile edge clips.

5. The apparatus of claim 1 wherein said low-profile integrated circuit chips are RAM chips.

* * * * *